United States Patent [19]

Wakimoto

[11] Patent Number: 5,739,635
[45] Date of Patent: Apr. 14, 1998

[54] ORGANIC ELECTROLUMINESCENT DEVICE

[75] Inventor: Takeo Wakimoto, Tsurugashima, Japan

[73] Assignee: Pioneer Electric Corporation, Tokyo, Japan

[21] Appl. No.: 636,407

[22] Filed: Apr. 23, 1996

[30] Foreign Application Priority Data

Apr. 27, 1995 [JP] Japan .................. 7-127181
Mar. 14, 1996 [JP] Japan .................. 8-085743

[51] Int. Cl.$^6$ ........................... H05B 33/22
[52] U.S. Cl. ........................... 313/504; 313/498
[58] Field of Search ........................... 313/498, 503, 313/504, 506, 509

[56] References Cited

U.S. PATENT DOCUMENTS

| | | | |
|---|---|---|---|
| 5,128,587 | 7/1992 | Skotheim et al. | 313/498 X |
| 5,200,668 | 4/1993 | Ohashi et al. | 313/498 |
| 5,429,884 | 7/1995 | Namiki et al. | 313/503 X |
| 5,458,977 | 10/1995 | Hosokawa et al. | 313/504 X |
| 5,500,568 | 3/1996 | Nakamura et al. | 313/503 |
| 5,516,577 | 5/1996 | Matsuura et al. | 313/504 X |
| 5,540,999 | 7/1996 | Yamamoto et al. | 313/503 X |

FOREIGN PATENT DOCUMENTS

| | | | |
|---|---|---|---|
| 243393 | 9/1989 | Japan | 313/503 |
| 159882 | 6/1993 | Japan | 313/503 |
| 326354 | 11/1994 | Japan | 313/503 |

*Primary Examiner*—Hezron E. Williams
*Assistant Examiner*—Daniel S. Larkin
*Attorney, Agent, or Firm*—Sughrue, Mion, Zinn, Macpeak & Seas, PLLC

[57] ABSTRACT

An organic electroluminescent device comprises an anode, a positive-hole transport layer made of an organic compound, an emitting layer made of an organic compound, an electron transport layer made of an organic compound, an electron-injecting layer, and a cathode which are layered in sequence. The electron-injecting layer is made of an alkaline metal compound comprising at least one of Li, Rb, Cs, Na, and K including alkaline metal oxides, alkaline metal peroxides, alkaline metal compound oxides, alkaline metal halides, alkaline metal nitride, and alkaline metal salt such as $Li_2O$, $Li_2O_2$, $Rb_2O$, $Cs_2O$, $Rb_2O_2$, $CS_2O_2$, $LiAlO_2$, $LiBO_2$, $LiCl$, $RbCl$, $NaCl$, $KAlO_2$, $Na_2WO_4$, $K_2SiO_3$, and $Li_2CO_3$.

6 Claims, 5 Drawing Sheets

EMISSION

EMISSION

EMISSION

EMISSION

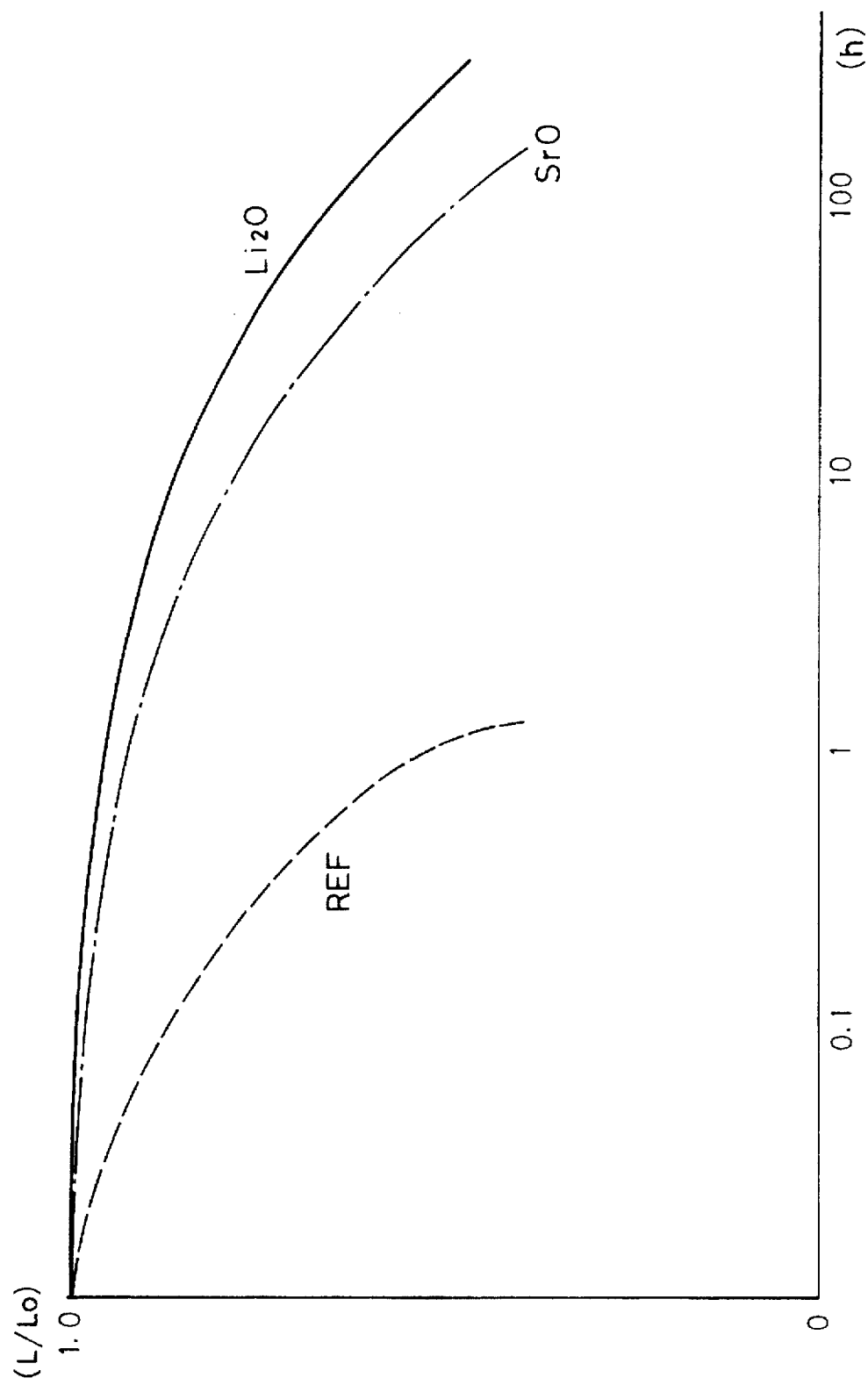

ORGANIC ELECTROLUMINESCENT DEVICE

BACKGROUND OF THE INVENTION

1. Field of the Invention

The present invention relates to an electroluminescent device (hereinafter referred as "EL device") having an emitting layer made of an emitting substance, which utilizes an electroluminescence phenomenon that the emitting substance emits light by applying an electric current to the emitting layer. More particularly, it is concerned with an organic EL device in which the emitting layer is made of an organic emitting substance.

2. Description of the Prior Art

As a prior art organic EL device structure, there have been known an organic EL device as shown in FIG. 1, in which an electron-injecting layer 6a, an organic electron transport layer 5, an emitting layer 3 and an organic hole transport layer 4 are laminated in sequence and are sandwiched as a whole between a metal cathode 1 and a transparent anode 2 on a glass substrate 7.

The hole transport layer 4 facilitates the injection of the holes from the anode and blocks electrons. The electron-injecting layer 6a facilitates the injection of electrons from the cathode. The electron transport layer 5 facilitates the transport of electrons from the electron-injecting layer 6a to the emitting layer 3. In the organic EL device, the recombination of electrons injected from the metal cathode 1 through the electron-injecting layer 6a and the organic electron transport layer 5 and holes injected from the transparent anode 2 to the emitting layer 3 generates excitons. The excitons emit light when they are deactivated through radiation. This light radiates toward outside through the transparent anode 2 and the glass substrate 7.

In addition, there is another organic EL device structure as shown in FIG. 2, in which an electron-injecting layer 6a, an emitting layer 3 and first and second hole transport layers 4a and 4b are laminated in sequence and are sandwiched as a whole between a metal cathode 1 and a transparent anode 2 on a glass substrate 7. The first and second hole transport layers 4a and 4b facilitates the ionization potential levels in a stepwise fashion to promote the injection of positive holes. The voltage to be applied to the EL device with the two hole transport layers is reduced rather than that with the single hole transport layer during the injection of electric current for the light emission.

The anode 2 is formed of an electric conductive material with a high work function such as indium-tin oxide (hereinafter referred as "ITO"). The cathode 1 is formed of a metal with a lower work function such as aluminum (Al), magnesium (Mg), indium (In), silver (Ag) or alloys of the individual metals thereof Al-Mg, Ag-Mg. The electron-injecting layer 6a is provided in order to expand the selection range of materials for the electrode layer. If the cathode 1 is made of a thin metal film with both a lower work function and a low electric resistance, it will be omitted. It is attempted that, for the electron-injecting layer 6a, a material containing at least one of alkaline earth metal oxides such as SrO, CaO or BaO is used in order to expand the selection range of materials for the electrode layer.

However, there is not combination of materials for the electron-injecting layer have a sufficient emission efficiency yet. There is a problem of decrease of luminance in the lapse during a continuous emission.

SUMMARY OF THE INVENTION

The object of the present invention is to provide an organic EL device is capable of continuously emitting at a high luminance.

The organic EL device according to the present invention comprises; an anode, a positive-hole transport layer made of an organic compound, an emitting layer made of an organic compound, an electron transport layer made of an organic compound and a cathode which are layered in sequence, further comprising an electron-injecting layer containing at least one of alkaline metal compounds and disposed between said emitting layer and said cathode.

In the present invention, the electron-injecting layer disposed between the emitting layer and the cathode layer is made of a compound containing at least one of alkaline metals such as Li, Rb, Cs, Na or K which has a low work function. Therefore, this EL device emits at a high luminance emitting by optimizing the thickness of the electron-injecting layer. The alkaline metal compounds are chemically more stable than a simple substance of alkaline metal and preferably reproduced in the properties thereof. Accordingly, the present invention achieves the organic EL device capable of continuously emitting light for a long time at a high luminance by applied a low voltage.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings which are incorporated in and constitute a part of this invention and, together with the description, serve to explain the principles of the invention in general terms. Like numerals refer to like parts throughout the disclosure.

BRIEF DESCRIPTION OF THE DRAWINGS

FIG. 5 shows a graph of luminance decrement property embodiment obtained from an embodiment of the organic EL device.

DETAILED DESCRIPTION OF PREFERRED EMBODIMENTS

The embodiments according to the present invention will be described in more detail with reference to the accompanying drawings.

Figure 1:
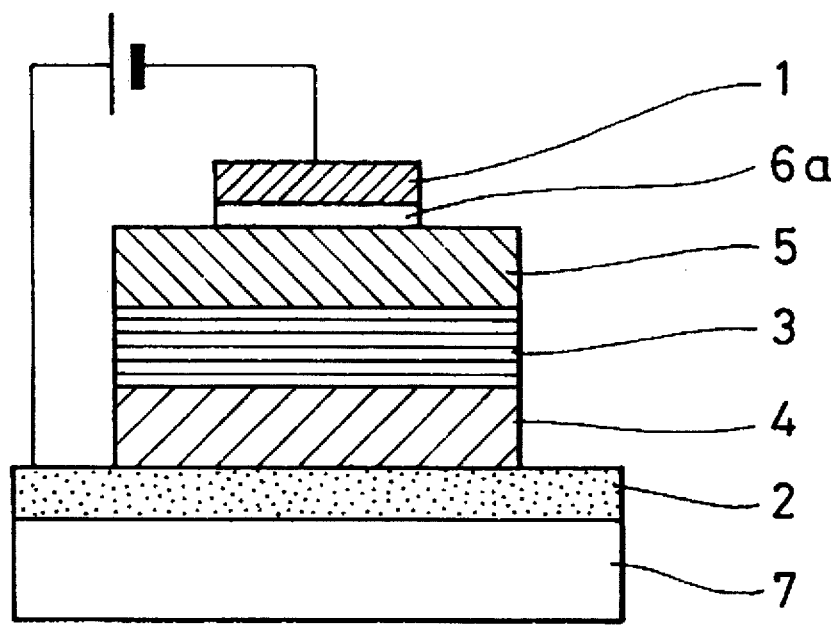
FIG. 1 is a schematic cross section view of an organic EL device.
Figure 1:
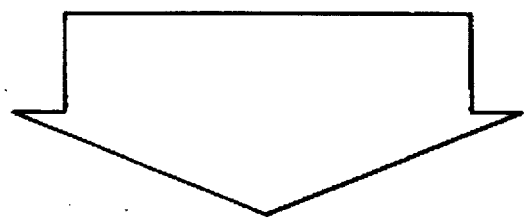
Figure 2:
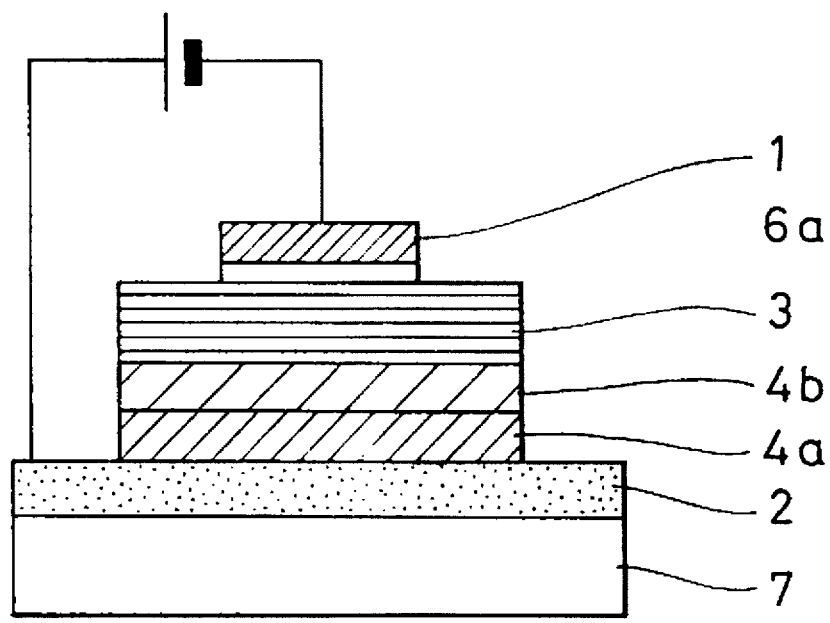
FIG. 2 is a schematic cross section view of another organic EL device.
Figure 2:
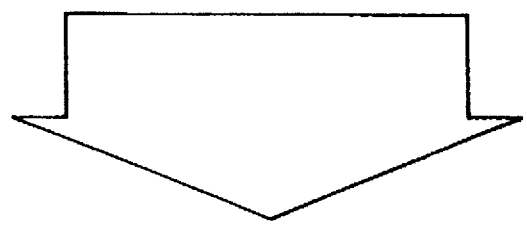
Figure 3:
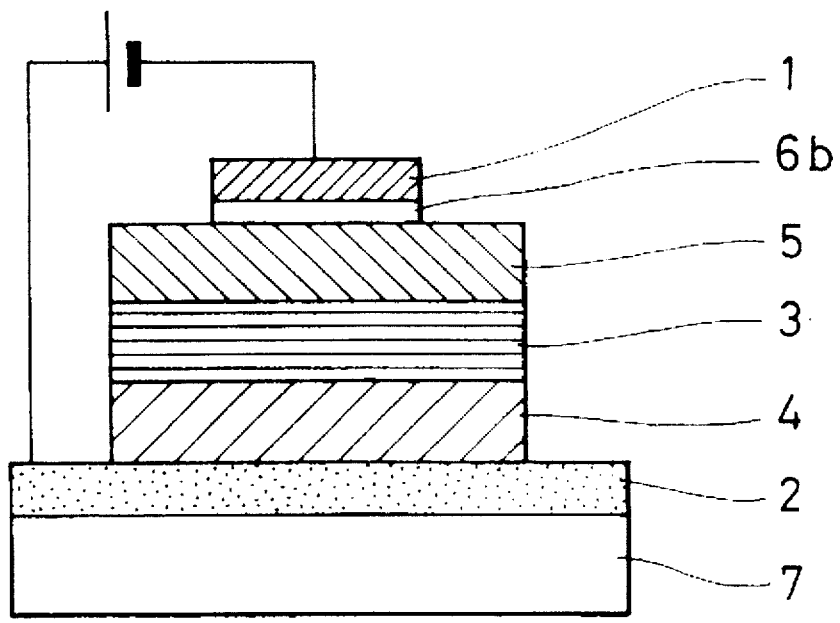
FIG. 3 is a schematic cross section view of an embodiment according to the present invention.
Figure 3:
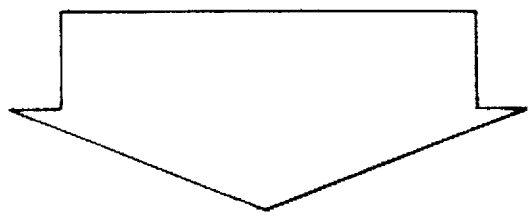

As shown in FIG. 3, the EL device in accordance with the present invention has an electron-injecting layer 6b, an organic electron transport layer 5, an emitting layer 3 and an organic hole transport layer 4 are laminated in sequence and are sandwiched as a whole between a metal cathode 1 and a transparent anode 2 on a glass substrate 7.

The electron-injecting layer 6b is made of an alkaline metal compound comprising at least one of Li, Rb, Cs, Na, and K including alkaline metal oxides, alkaline metal peroxides, alkaline metal compound oxides, alkaline metal halides, alkaline metal nitrides, and alkaline metal salts such as $Li_2O$, $Li_2O_2$, $Rb_2O$, $Cs_2O$, $Rb_2O_2$, $CS_2O_2$, $LiAlO_2$, $LiBO_2$, $LiCl$, $RbCl$, $NaCl$, $KAlO_2$, $Na_2WO_4$, $K_2SiO_3$, and $Li_2CO_3$. Although the electron-injecting layer 6b having a very low work function acts as an insulator, this EL device emits at a high luminance emitting by optimizing the thickness of the electron-injecting layer. Since the alkaline metal compounds are chemically stable, the treatment thereof is easy. It is therefore preferable to reproduce the property of the EL device. Accordingly, the present invention achieves a constant production of the organic EL device capable of emitting light for a long time.

The thickness of the electron-injecting layer 6b is required at one angstrom or more on the average. The emission of the EL device is due to the recombination of electrons and holes in the emitting layer as mentioned above. In other words, such an emission relies on electric current across the electrodes. Since the electron-injecting layer is an insulator, its thickness is preferable at 500 angstrom or less to prevent from obstructing electric current in the device.

The anode 2 is formed of an electric conductive material with a high work function such as ITO, tin oxides. The cathode 1 is formed of a metal with a lower work function such as Al, Mg, In, Ag, or alloys of the individual metals. The anode 2 may be formed of a metal or substance with a higher work function than that of the cathode 1. In these cases, at least one of the electrodes 1 and 2 may be transparent. The electrodes may be made of transparent conductive materials.

The emitting layer 3 is formed of a fluorescent material preferably, a fluorescent dye with a high quantum yield such as tris(8-hydroxyquinolinol)aluminum (hereinafter referred as "Alq$_3$") or an aluminum oxine complex.

The emitting layer 3 may be made of both an organic host substance having a capability of transporting a carrier and an organic guest substance having a capability of emitting light in response to either the recombination of electron and positive-hole or the energy transferred from the host substance. This is so-called a guest-host type emitting layer. An example of the host substance is Alq$_3$, for this cumarin derivatives, dicyanomethlene derivatives, or quinacridone derivatives are preferably used as guest substances in the emitting layer. The host substance having the absolute values of oxidation and reduction potential being comparatively large in the cyclic voltammetry (CV) is used for the host substance of the emitting layer 3. A substance having of the absolute values of oxidation and reduction potential being comparatively small in the CV is preferably used for the guest substance of the emitting layer 3. The more the overlapped portion of the spectral distributions of both the wavelengths stimulated from absorption wavelengths of the guest substance and fluorescent wavelengths of the host substance, the higher the emitting efficiency becomes in the EL device. The guest substance is preferably selected from fluorescent dyes with a high quantum yield. The guest substance is contained at a concentration 0.01 wt.% through 10 wt.%1 in the fluorescent emitting layer comprising the host material, because the emission with a high luminance of the EL device can be obtained at a low applied voltage.

The organic hole transport layer 4 is formed of a compound of a so-called CTM (Carrier Transporting Materials) capable of transporting holes as a mixture thereof or a lamination thereof. It is preferable that the hole transport layer is made of N, N'-diphenyl-N-N'-bis(3-methylphenyl)-1,1'-biphenyl-4,4'-diamine (hereinafter referred as "TPD"), Copper phthalocyanine, or 4, 4', 4"-tris[N-(3-methylphenyl)-N-phenylamino]triphenylamine (hereinafter referred as "MTDATA").

The electron transport layer 5 is formed of a compound capable of transporting electrons as a mixture thereof or a lamination thereof. It is preferable that the electron transport layer 5 is preferably made of so-called Bu-PBD which is 2-(4'-tert-butylphenyl)-5-(biphenyl)-1,3,4-oxadiazole. Alq$_3$ or perylene derivatives.

Figure 4:
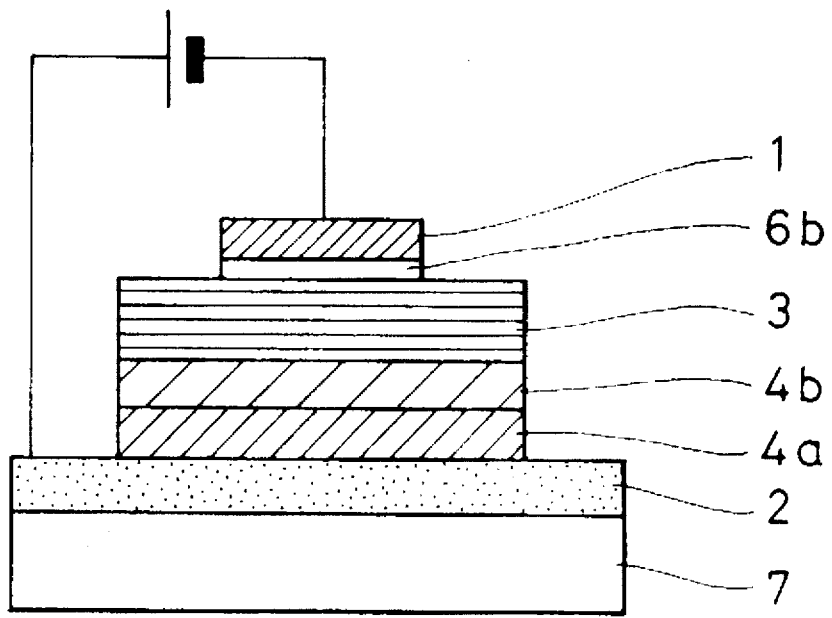
FIG. 4 is a schematic cross section view of another embodiment according to the present invention.
Figure 4:
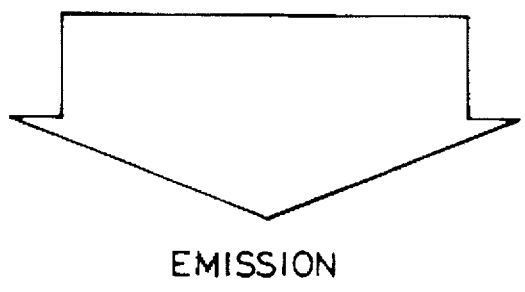

In addition, another embodiment according to the invention is shown in FIG. 4, in which an electron-injecting layer 6b, an emitting layer 3 and first and second hole transport layers 4a and 4b are laminated in sequence and are sandwiched as a whole between a metal cathode 1 and a transparent anode 2 on a glass substrate 7.

The inventor manufactured concretely organic EL devices each having the structure as shown in FIG. 4 under conditions of the deposition rates and the corresponding thin film making methods as shown in Table 1. Each manufactured EL device was constructed so that a first hole transport layer 4a, a second hole transport layers 4b, an emitting layer 3, an electron-injecting layer 6b, and a metal cathode 1 were laminated in sequence on stripe ITO transparent anodes 2 previously formed on the surface of a glass substrate 7.

TABLE 1

| No.: Function-layer | Deposition rate (Angstroms/sec.) | Thin-film-deposition | Thickness (Angstroms) |
|---|---|---|---|
| 4a: MTDATA | 2–4 | Resistance heating | 300 |
| 4b: TPD | 2–4 | Resistance heating | 300 |
| 3: Alq$_3$ | 2–4 | Resistance heating | 550 |
| 6b: Li$_2$O | 1–2 | Electron beam or Resistance heating | 1, 4, 8, 12, and 22 |
| 1: Al | 7–14 | Resistance heating | 1500 |

In addition, comparative EL devices were manufactured under the same conditions as the above embodiments excepting the electron-injecting layer was excluded from between the emitting layer and the cathode, i.e., the electron-injecting layer is at zero angstroms. Other comparative EL devices were manufactured under the same conditions as the above embodiments excepting the electron-injecting layers were made of SrO at thickness of 1, 5, and 10 angstroms respectively.

The first hole transport layer 4a made of MTDATA has high heat-resistant properties such as a high melting point, a high glass transition point and a high electric conductivity. Since the MTDATA layer is hardly crystallized for a long time and has excellent shielding properties against a surface of another substance, it contributes a high performance organic EL device in the embodiments in which the elevation of temperature of the device is suppressed during the application of a driving current and further the quantum efficiency of the device is increased.

Table 2 shows luminance-emitting efficiency properties of five embodiments having the electron-injecting layers of Li$_2$O with 1, 4, 8, 12, and 22 angstrom thickness respectively and the first comparative EL device at luminance, 300 cd/m$^2$.

TABLE 2

| | Li$_2$O thickness (Angstroms) | Emitting efficiency (lm/W) |
|---|---|---|
| Comparative 1 | 0 | 0.49 |
| Embodiment 1 | 1 | 0.91 |
| Embodiment 2 | 4 | 1.86 |
| Embodiment 3 | 8 | 2.95 |
| Embodiment 4 | 12 | 2.88 |
| Embodiment 5 | 22 | 2.32 |

Table 3 shows luminance-emitting efficiencies of other comparative EL devices having the electron-injecting layers of SrO at luminance, 300 cd/m$^2$.

TABLE 3

|  | SrO thickness (Angstroms) | Emitting efficiency (lm/W) |
|---|---|---|
| Comparative 2 | 0 | 0.49 |
| Comparative 3 | 1 | 0.94 |
| Comparative 4 | 5 | 1.90 |
| Comparative 5 | 10 | 1.40 |

FIG. 5 shows luminance decrement properties resulting from the running of emission tests of the above embodiments and comparatives of the organic EL devices. The graph shows luminance ratio [lapse luminance (L) / initial luminance (L0)] at the coordinate and the lapse of time [hours] at the logarithmic abscissa.

As seen from the result, embodiments with the interposition of $Li_2O$ electron-injecting layers at a range of 1–22 angstroms were remarkably improved in the emitting property and the life time in comparison with the comparative EL devices with SrO electron-injecting layers and excluding the $Li_2O$ electron-injecting layers. Particularly, the EL device comprising the $Li_2O$ electron-injecting layer with 8 angstroms was excellent in Table 2. The embodiments of the EL devices comprising the $Li_2O$ electron-injecting layer having a thickness range of 1–30 angstroms were preferable because they have high emitting efficiencies greater than 1.0 (lm/W) at luminance, 300 $cd/m^2$, as seen from Table 2.

Furthermore, other embodiments of EL devices were manufactured under the same conditions as the above embodiments excepting the electron-injecting layers were made of $Li_2O_2$, $LiAlO_2$, $LiBO_2$, $LiCl$, $Cs_2O$, $NaCl$, $Na_2WO_4$, $KAlO_2$, $K_2SiO_3$, $RbCl$, and $Li_2CO_3$ at thickness of 10, 20, 30, 40, 50, 60, 80, and 100 angstroms respectively.

Tables 4 and 5 show luminance-emitting efficiency properties of these embodiments having the alkaline -metal-compound-electron-injecting layers with the above thicknesses respectively at luminance, 300 $cd/m^2$.

TABLE 4

| Thickness | Emitting efficiency (lm/W) Alkaline-metal-compound-electron-injecting layer | | | | | |
|---|---|---|---|---|---|---|
| (Angstroms) | $Li_2O_2$ | $LiAlO_2$ | $LiBO_2$ | $LiCl$ | $Cs_2O$ | $NaCl$ |
| 10 | 1.15 | 1.45 | 1.84 | 2.70 | 1.28 | 2.00 |
| 20 | 1.48 | 1.89 | 1.95 | 2.86 | 1.88 | 2.14 |
| 30 | 1.88 | 1.83 | 2.62 | 2.51 | 2.34 | 2.30 |
| 40 | 1.90 | 2.44 | 2.53 | 3.00 | 2.70 | 2.52 |
| 50 | 1.93 | 2.39 | 2.43 | — | 2.92 | 2.63 |
| 60 | 1.52 | 2.58 | 2.47 | — | 2.82 | 2.60 |
| 80 | 1.79 | 2.29 | 2.60 | 2.86 | 3.00 | 2.53 |
| 100 | 1.33 | 2.60 | 2.77 | — | 3.00 | 2.52 |

TABLE 5

| Thickness | Emitting efficiency (lm/W) Alkaline-metal-compound-electron-injecting layer | | | | |
|---|---|---|---|---|---|
| (Angstroms) | $Na_2WO_4$ | $KAlO_2$ | $K_2SiO_3$ | $RbCl$ | $Li_2CO_3$ |
| 10 | 2.77 | 2.85 | 2.32 | 1.42 | 2.97 |
| 20 | 2.84 | 2.87 | 2.72 | 1.82 | 1.78 |
| 30 | 2.87 | 3.06 | 2.55 | 2.03 | 1.70 |
| 40 | 2.68 | 2.98 | 2.14 | 2.16 | 1.23 |
| 50 | — | — | — | — | — |
| 60 | — | 2.82 | 2.82 | 2.73 | — |
| 80 | — | 2.56 | 2.56 | 2.75 | — |
| 100 | — | 2.03 | 2.03 | 2.90 | — |

As seen from the results, the improvement of these embodiments with the interposition of the alkaline -metal-compound-electron-injecting layer is confirmed. The embodiments of the EL devices comprising the alkaline -metal-compound-electron-injecting layer having a thickness range of 1–100 angstroms preferably have high emitting efficiencies greater than 1.0 (lm/W) at luminance, 300 $cd/m^2$, as seen from Tables 4 and 5.

As described above, the organic EL device according to the present invention comprises the anode, the organic hole transport layer, the organic emitting layer, the organic electron transport layer, and the cathode which are laminated and sequence in characterized in that the device further comprises the alkaline -metal-compound-electron-injecting layer inserted between the organic electron transport layer and the cathode. Thus, it is possible according to the present invention to improve the emitting efficiency of the organic EL device which stably emits light at a high luminance upon application of a low voltage for a long time. Moreover, the selection scope of cathode materials is expanded. Furthermore, these preferable properties of the EL device are repeatedly reproduced in the manufacturing process thereof.

It should thus be apparent that the scope of the teaching of this invention is not intended to be limited by only the embodiments that have been expressly disclosed and illustrated, but that instead the scope of the teaching of this invention should be read as being commensurate with the scope of the claims that follow.

What is claimed is:

1. An organic electroluminescent device comprising an anode made of a conductive material, a positive-hole transport layer made of an organic compound, an emitting layer made of an organic compound, and a cathode made of a conductive material which are layered in sequence, further comprising an electron-injecting layer of an insulator thin film having a thickness of 1–100 angstroms on average, comprising at least one of alkaline metal compounds, and disposed between said emitting layer and said cathode, wherein the alkaline metal compound contained in the electron-injecting layer is selected from the group consisting of alkaline metal oxides, alkaline metal peroxides, alkaline metal compound oxides, alkaline metal halides, alkaline metal nitrides, and alkaline metal salts.

2. An organic electroluminescent device according to claim 1, wherein the alkaline metal compound contained in the electron-injecting layer is a lithium compound selected from the group consisting of lithium oxides, lithium peroxides, lithium compound oxides, lithium halides, lithium nitrides, and lithium salts.

3. An organic electroluminescent device according to claim 1, wherein the alkaline metal compound contained in the electron-injecting layer is a sodium compound selected from the group consisting of sodium oxides, sodium peroxides, sodium compound oxides, sodium halides, sodium nitrides, and sodium salts.

4. An organic electroluminescent device according to claim 1, wherein the alkaline metal compound contained in the electron-injecting layer is a potassium compound selected from the group consisting of potassium oxides, potassium peroxides, potassium compound oxides, potassium halides, potassium nitrides, and potassium salts.

5. An organic electroluminescent device according to claim 1, wherein the alkaline metal compound contained in the electron-injecting layer is a rubidium compound selected from the group consisting of rubidium oxides, rubidium peroxides, rubidium compound oxides, rubidium halides, rubidium nitrides, and rubidium salts.

6. An organic electroluminescent device according to claim 1, wherein the alkaline metal compound contained in the electron-injecting layer is a cesium compound selected from the group consisting of cesium oxides, cesium peroxides, cesium compound oxides, cesium halides, cesium nitrides, and cesium salts.

* * * * *